Figure 1:
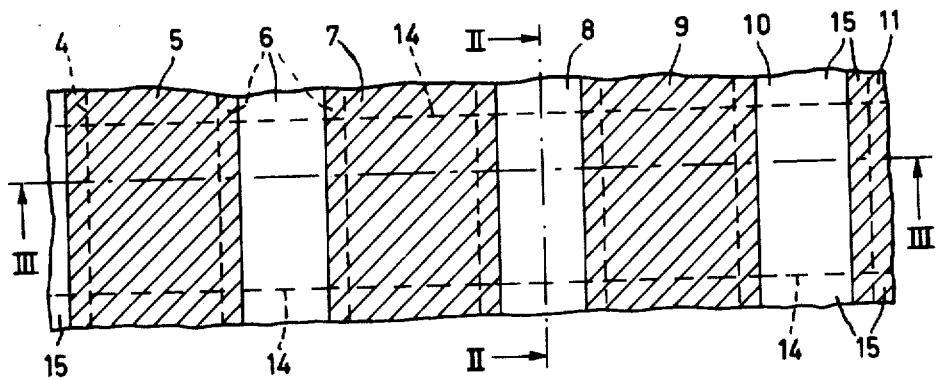

United States Patent [19]

Esser

[11] 4,012,758
[45] * Mar. 15, 1977

[54] BULK CHANNEL CHARGE TRANSFER DEVICE WITH BIAS CHARGE

[75] Inventor: Leonard Jan Maria Esser, Eindhoven, Netherlands

[73] Assignee: U.S. Philips Corporation, New York, N.Y.

[ * ] Notice: The portion of the term of this patent subsequent to Mar. 15, 1994, has been disclaimed.

[22] Filed: Oct. 2, 1975

[21] Appl. No.: 618,928

Related U.S. Application Data

[63] Continuation of Ser. No. 452,714, March 20, 1974, abandoned.

[30] Foreign Application Priority Data

Dec. 3, 1973 Netherlands ............... 7316495

[52] U.S. Cl. .................. 357/24; 307/221 D; 357/89
[51] Int. Cl.² ............... H01L 29/78; G11C 19/28
[58] Field of Search ......... 357/24; 307/221 D, 304

[56] References Cited

UNITED STATES PATENTS

| | | | |
|---|---|---|---|
| 3,660,697 | 5/1972 | Berlund et al. | 357/24 |
| 3,784,847 | 1/1974 | Kurz et al. | 357/24 |
| 3,792,322 | 2/1974 | Boyle et al. | 357/24 |
| 3,796,932 | 3/1974 | Amelio et al. | 357/24 |

OTHER PUBLICATIONS

Kosonocky et al. "Two-phase Charge Coupled Devices with Overlapping Polysilicon and Aluminum Gates" RCA Review vol. 34 (3/73) pp. 164–203.

Erb et al. "An Overlapping Electrode Buried Channel CCD" IEEE Int. Electron Device Meeting Tech. Dig. (12/73) pp. 24–26.

Erb and Nummedal "Buried Channel Charge for Infrared Applications" CCD Applications Conf., San Diego, Proc. (9/73) pp. 157–167.

Esser "The Peristaltic Charge Coupled Device" CCD Applications Conf., San Diego, Proc. (9/73) pp. 269–275.

Takemoto et al. "Bulk Charge-Transfer Device" Proc. 5th Int. Conf. Solid State Device, Tokyo (8/73) publ. in Journal Japan Society of Applied Physics, vol. 43 (4/74) supplement pp. 264–268.

*Primary Examiner*—William D. Larkins
*Assistant Examiner*—Gene M. Munson
*Attorney, Agent, or Firm*—Frank R. Trifari; Jack Oisher

[57] ABSTRACT

A charge transfer device in which information in the form of packets of majority charge carriers can be transported through the bulk of a semiconductor layer via charge storage sites, in which the semiconductor regions belonging to the storage sites have a more highly and a lower doped part of the same conductivity type and in which means are present to introduce packets of background charge, so that each packet of information-representing charge can be transported together with a packet of background charge as a collective charge packet.

4 Claims, 4 Drawing Figures

BULK CHANNEL CHARGE TRANSFER DEVICE WITH BIAS CHARGE

This is a continuation of application Ser. No. 452,714, filed Mar. 20, 1974 now abandoned.

The invention relates to a charge transfer device having a semiconductor body comprising a semiconductor layer of one conductivity type, in which means are present to isolate the semiconductor layer from the surroundings, and said layer has a thickness and a doping concentration such that a depletion region can be obtained throughout the thickness of the semiconductor layer by means of an electric field while avoiding breakdown, in which means are present to locally introduce into the semiconductor layer information in the form of charge consisting of majority charge carriers and means to read out said information elsewhere in the layer, in which an electrode system is present on at least one side of the layer to capacitively produce electric fields in the semiconductor layer by means of which the charge can be transported to the read-out means through the semiconductor layer in a direction parallel to the layer.

The invention relates more in particular to the charge transfer device of this type which forms the subject matter of the non-pre-published Dutch Patent Application No. 7,303,778, also filed in the U.S. Patent Office on Mar. 14, 1974, under Ser. No. 450,996.

During operation of said charge transfer device a considerable improvement in charge transport efficiency can be achieved when the information is superimposed upon a background signal in such manner that during ech transfer of charge from a capacitive storage place to the next capacitive storage place at least a certain minimum quantity of charge determined by the background signal is involved in the transfer process. The surprising feature, explained in greater detail later, of said improvement also is that said method of operation generally provides no improvement in the charge-transfer devices in which the charge transport takes place in the interior or the bulk of the semiconductor layer and to which type of charge-transfer devices the present device also belongs.

According to the invention, a charge-transfer device having a semiconductor body comprising a semiconductor layer of one conductivity type, in which means are present to isolate the semiconductor layer from the surroundings and said layer has a thickness and a doping concentration such that a depletion region can be obtained throughout the thickness of the semiconductor layer by means of an electric field while avoiding breakdown, in which means are present to locally introduce into the semiconductor layer information in the form of charge consisting of modulated charge carriers and means to read out said information elsewhere in the layer, in which an electrode system is present on at least one side of the layer to capacitively produce electric fields in the semiconductor layer by means of which the charge can be transferred to the read-out means through the semiconductor layer in a direction parallel to the layer, is characterized in that at least locally below the electrode system the semiconductor layer has a surface zone of one conductivity type which is more highly doped than the adjoining part of the semiconductor layer and which extends in the semiconductor layer only over a part of the thickness of the layer, means being present to locally introduce a constant quantity of majority charge carriers as a background quantity, the information being transferred to the read-out means as a quantity of majority charge carriers superimposed upon the background quantity and together with said background quantity.

When the device is constructed as an image sensor, the said means may be formed, for example, by an auxiliary source of radiation which irradiates the device uniformly, so with an intensity which is equal everywhere, in which said auxiliary radiation may be incident on the device continuously or prior to, during or after the integration period. In the case of an image sensor the background signal is preferably supplied as an electric signal. An important embodiment of the device according to the invention is characterized in that means are present to supply periodic signals to the electrode system, which periodic signals control the charge transport, input means being present to supply a background signal to means for the local introduction of majority charge carriers during each cycle of the signals supplied to the electrode system so that during each cycle a constant quantity of majority charge carriers is introduced into the semiconductor layer and forms the background quantity on which the information in the form of further supplied charge carriers is superimposed.

Electric input signals may also be supplied to the device. A preferred embodiment is characterized in that means are further present to supply information-representing electric signals to at least a part of the means for the local introduction of majority charge carriers.

Figure 2:
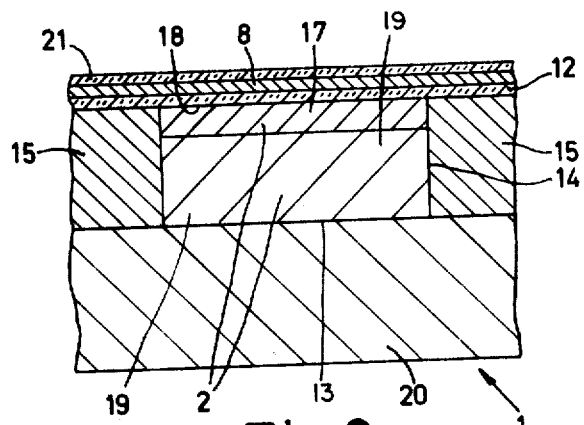
Figure 4:
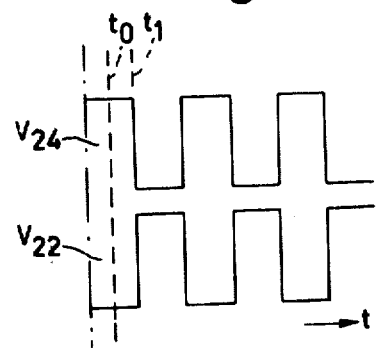
Figure 3:
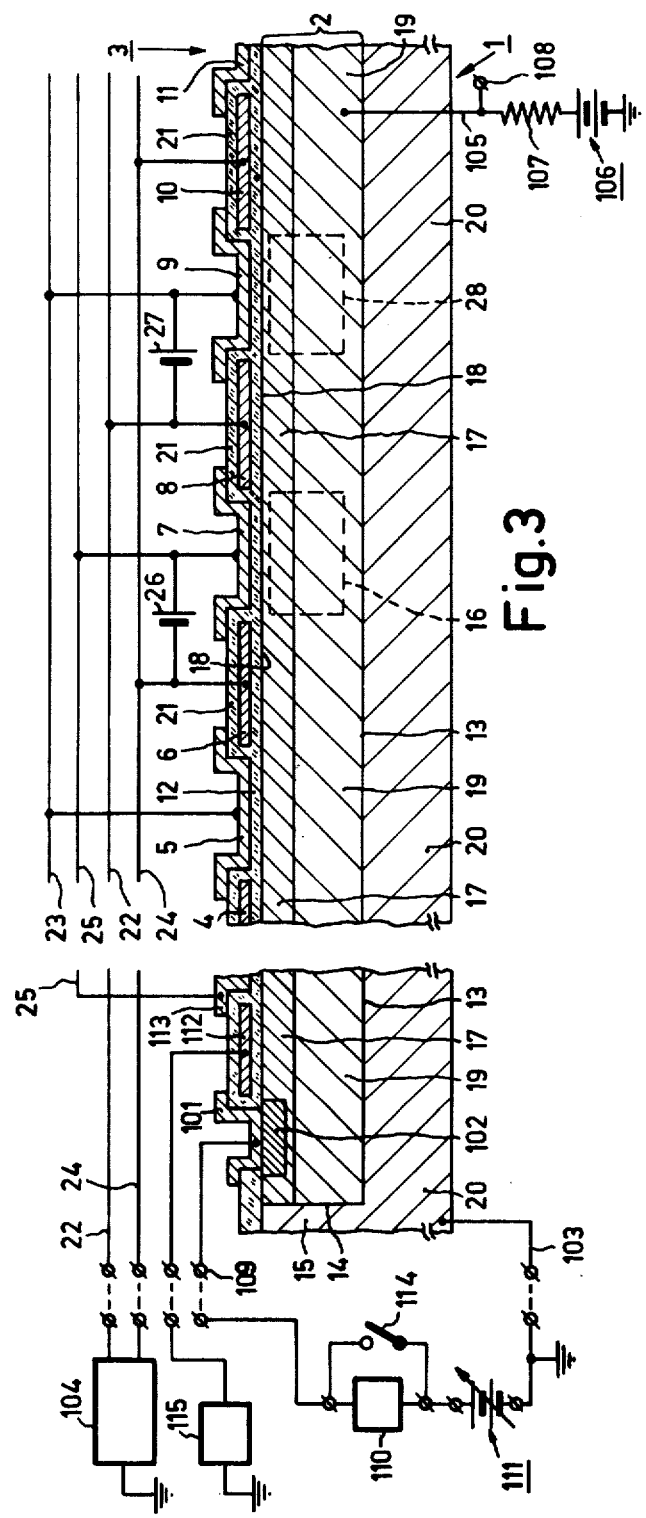

The invention will now be described in greater detail with reference to a few embodiments and the accompanying diagrammatic drawing, in which:

FIG. 1 is a diagrammatic plan view of a part of a charge transfer device according to the invention, and of which FIG. 2 is a cross-sectional view taken on the line II—II of FIG. 1, and FIG. 3 is a cross-sectional view taken on the line III—III of FIG. 1 completed by a diagrammatic sectional view of a part of the device which comprises an electric input for the charge transfer device, FIG. 4 shows clock voltages which can be supplied to the electrode system of the device shown in FIGS. 1 to 3 in accordance with time.

FIG. 1 is a plan view of a charge transfer device (sometimes referred to as CTD or as "Charge-Coupled Device" or CCD) of a type which is described in the Dutch Patent Application No. 7,114,770. The device comprises a semiconductor body 1 (see FIGS. 2, 3) having a semiconductor layer 2 of n-type silicon.

Except possibly for the introduction and the read-out of the charge to be transported through the device, the semiconductor layer 2 may be isolated from the surroundings at least during operation. For that purpose means are present which are formed, for example, by the insulating layer 12 by means of which the layer 2 is insulated from the surroundings on the side 3, while on the oppositely located side and the sides of the layer 2, respectively, isolation may be effected by p-n junctions 13 and 14, respectively reversely-biased during operation. Thus, the substrate 20 is P-type. However, the isolation may also be obtained differently. For example, the p-type isolation zone 15 (see FIG. 2) which forms the p-n junction 14 with the layer 2 may be replaced entirely or partly by a layer of insulating material, for example silicon oxide, which is inset in the layer 2 over a part of its thickness. In FIG. 1 the p-n junction 14 which thus forms the lateral boundary of the layer 2 is denoted by broken lines.

The layer 2 has such a thickness and a doping concentration that a depletion region can be formed throughout the thickness of the layer 2 by means of an electric field while avoiding breakdown. Such a breakdown may consist, for example, of an avalanche multiplication in the layer 2. Means are further present to locally introduce into the layer 2 information in the form of charge consisting of majority charge carriers. Said means may comprise, for example, a contact 101 (FIG. 3) on the semiconductor layer for connection of an electric signal source. However, said means may also comprise an electromagnetic source of irradiation the emitted radiation of which is converted into charge carriers after absorption in the semiconductor layer 2.

Majority charge carriers are to be understood to mean in this connection mobile charge carriers of the type which in the semiconductor layer 2 in thermal equilibrium and in the absence of electric fields is in the majority.

FIG. 3 shows beside the right-hand part which is the cross-sectional view taken on the line III—III of FIG. 1 a diagrammatic cross-sectional view in the left-hand part of the input of the charge transfer device. Said left-hand part comprises the said contact on the semiconductor layer 2 which is formed by the conductive layer 101. If necessary, a more highly doped contact zone 102 of the one conductivity type is present below said conductive layer 101 so as to obtain an ohmic connection between the conductive layer 101 and the semiconductor layer 2. The surface concentration of the impurities in said zone 102 is, for example, between $10^{18}$ and $10^{21}$ atoms/ccm.

Means are furthermore present to read-out said charge elsewhere in the layer 2. Said means which are not shown in the figures may comprise, for example, an ohmic connection contact.

Present on the side 3 of the semiconductor layer 2 in an electrode system 4–11 to capacitively produce electric fields in the layer 2 by means of which the charge can be transferred to the said readout means through the semiconductor layer 2 in a direction parallel to the layer 2.

The electrode system may comprise, for example, a piezoelectric layer with which an acoustic wave can be converted into an electric wave. In the present embodiment, however, the electrode system comprises a number of electrodes 4–11 which are separated from the semiconductor layer 2 by a blocking or barrier layer 12 of silicon oxide. The layer 2 which is usually transparent is not shown in FIG. 1 for clarity.

The edges of the electrodes 4, 6, 8 and 10 which as shown in FIG. 3 are present below the electrodes 5, 7, 9 and 11 are denoted in FIG. 1 by broken lines. As is shown in FIGS. 1 and 3, the electrodes 4–11 extend in a direction transverse to the charge transfer direction throughout the width of the semiconductor layer 2.

As is shown in FIGS. 2 and 3, the semiconductor layer 2 has below the electrodes 4–11 an n-type surface zone 17 which is more highly doped than the adjoining part 19 of the semiconductor layer 2.

As is clearly shown in FIGS. 2 and 3 the surface zone 17 extends only over a top part of the thickness of the semiconductor layer 2 in down into said layer.

The semiconductor layer 2 in the present embodiment has a layer-shaped surface zone 17 which extends substantially along the whole surface 18 of the semiconductor layer 2.

The surface zone 17 and the adjoining part 19 of the semiconductor layer 2 may simply be formed by n-type epitaxial layers which re provided one on top of the other and mutually have different doping concentrations. In the present embodiment the lower doped part 19 of the layer 2 is deposited in the form of an epitaxial layer on the substrate 20 of p-type silicon and a more highly doped surface zone 17 in the form of a second epitaxial layer is deposited on the lower doped region 19.

As is shown for example, FIGS. 1 and 3 the electrodes 4–11 overlap each other partly so that the mutual effective distances between the electrodes may be very small. Such an electrode system can be obtained by means of known methods in which for the electrodes 4, 6, 8 and 10 polyerystalline silicon is used, for exaple, and for the electrodes 5, 7, 9 and 11 a metal is used, for example aluminum. The mutual electric isolation between on the one hand the electrodes 4, 6, 8 and 10 and on the other hand the electrodes 5, 7, 9 and 11 can be obtained by oxidizing the polycrystalline silicon partly so that the silicon oxide layer 21 is obtained.

As shown in FIG. 3, the electrodes are subdivided into four groups in which the electrodes 4 and 8 belong to a first group of electrodes which are interconnected by the clock voltage line 22, the electrodes 5 and 9 belong to a second group which are interconnected by the clock line 23, the electrodes 6 and 10 belong to a third group of electrodes which are interconnected by the clock line 24 and the electrodes 7 and 11 belong to the fourth group of electrodes which are interconnected by the clock line 25.

A direct voltage source 26 shown diagrammatically is connected between the electrodes associated with the line 24 and the electrodes associated with the line 25, while a direct voltage source 27 shown diagrammatically in connected between the electrodes associated with the line 22 and the electrodes associated with the line 23. The voltage sources 26 and 27 each supply a voltage of approximately 5 volts. The voltage sources 26 and 27 cause an asymmetry in the system and hence a preferred direction for the charge transfer so that the device can be operated as a two-phase charge transfer device. During operation, for example, the clock voltage lines 22 ad 24 are connected to voltage sources not shown by means of which the clock voltages $V_{22}$ and $V_{24}$, respectively, shown in FIG. 4 can be applied to the clock lines 22 and 24, respectively. The clock voltages $V_2$ and $V_{24}$ each show two levels, a low level of approximately 0 Volt and a high level of approximately 10 Volts, the level of 0 Volt corresponding to the potential which is applied to the substrate 20. Instead of the clock voltages shown in FIG. 4, other clock voltages may of course also be used, for example, voltages which show more than two levels or voltages which show a more sawtooth-like character as a function of time. The semiconductor layer 2 is set up at a level of approximately 20 Volts, for example, via the output contact, so that in the absence of information-representing charge carriers at the given voltage levels of the electrodes 4–11 and the substrate 20 the semiconductor layer is depleted throughout its thickness. When a signal in the form of majority charge carriers, so in the form of electrons, is supplied to the semiconductor layer 2, said signal will be stored in a part of the semiconductor layer 2 under an electrode having the largest positive voltage. At the instant $t_0$ (see FIG. 4) at which the electrode 6 is at 10 Volts, the electrode 7 is at the highest potential as a result of the voltage source 26, and the part which is present under said electrode and is enclosed diagrammatically by the broken lines 16 is filled by signal-representing majority charge carriers, so electrons.

The voltage which should be applied to the electrode 7 to keep together the quantity of charge stored in the region 16 depends, besides as regards the value of the charge, on the distance between the charge and the electrode. According as said distance is larger, which means that, capacitively, the charge is less strongly coupled to the electrode, said voltage should be larger. By providing the more highly doped surface zone 17 at the surface 18 of the semiconductor layer 2 it is achieved that the greater part of the charge is concentrated near the surface 18 and hence very closely to the electrode 7 where the capacitive coupling to the electrode 7 is relatively large. As a result of this, the charge transfer device can be operated with smaller clock voltages — with the same quantity of charge — than when using a homogeneously doped epitaxial layer 2. In addition, due to the higher doping of the layer 17, the charge is concentrated very closely to the surface 18, it is true, but at a finite distance from said surface, so that — at least in the case in which the semiconductor device is not operated in accumulation— the possibility that charge is trapped in states at the surface 18 is considerably reduced.

At the instant $t_1$ denoted in FIG. 4 the voltage $V_{24}$ reduces to 0 volt, while $V_{22}$ comes at the level of 10 Volts. As a result of this, the electrons stored in the part 16 of the semiconductor layer 2 are transported to the part of the semiconductor layer 2 present opposite to the electrode 9 and surrounded by the broken line 28, the region 16 being depleted mainly in the direction from the surface 18 to the substrate 20. The transport rate can be very high with a high transport efficiency since, although the capacitive coupling between the charge and the electrodes as a result of the higher doping concentration of the surface zone 17 is large, the transport rate is mainly determined by the last fractions of charge still to be transferred. These last fractions are transferred deep in the interior of the semiconductor layer 2, are hence coupled to the electrodes only weakly and can as a result of this be transferred comparatively rapidly.

In the present embodiment the lower doped adjoining part 19 of the layer 2 has a thickness of approximately 5 $\mu$m and a doping concentration of approximately $5.10^{14}$ atoms/ccm, and the more highly doped surface zone 17 has a thickness of approximately 0.3 $\mu$m and a doping concentration of approximately $4.10^{16}$ atoms/ccm. In general, as described in said Dutch application No. 7,303,778, the dopant concentration of the surface zone 17 should be greater than ten times that of said adjoining part 19, and the thickness of the surface zone 17 should be less than one-half the combined thickness of the double layer 17, 19. The width of the semiconductor layer 2 transverse to the direction of charge transport is approximately 20 $\mu$m and the width of the electrodes 4–11 in the direction of charge transport is approximately 10 $\mu$m. The quantity of charge which can be stored per bit of the charge transfer device is approximately 0.15 pC, in which it is to be noted that this represents approximately the maximum charge at which at the given voltages spreading of the charge does not yet occur. Approximately 80 percent of said charge can be stored in the highly doped surface zone 17, so very closely to the electrodes, so that comparatively little voltage is necessary for said fraction, while only approximately 20 percent can be stored in the lower doped adjoining part 19, so at a larger distance from the electrodes.

Although a possible method of operation was already described above, the transport efficiency can still be increased by taking further measures. In this preferred method of operation, means are present to locally introduce a constant quantity of majority charge carriers into the semiconductor layer 2 as a background quantity, the information being transported to the read-out means as a quantity of majority charge carriers superimposed upon the background quantity and together with said background quantity. As a background, a series of equally large charge packets is thus applied, an information-representing signal in the form of a charge packet consisting of further introduced charge carriers being or not being added to each of said charge packets.

Like most of the charge transfer devices, the present one may also be constructed as an image sensor. In that case, radiation is incident in known manner on the device in which the picture is converted by absorption of radiation and generation of electron-hole pairs into a charge pattern which corresponds to the picture and which is stored in one or more of the capacitive storage sites. After a certain integration time the charge pattern then formed is usually transported to the read-out means and is read out sequentially.

In the present sensor the above-mentioned means for the local introduction of a constant quantity of majority charge carriers may consist of an auxiliary source of radiation (not shown) which irradiates the charge transfer device uniformly, so with an intensity which is the same everywhere. Such an auxiliary radiation may be both continuous and be used periodically prior to, during or after the integration period. It is of importance that at least during the transport process to the read-out means each of the information-representing charge packets is superimposed upon a background quantity of majority charge carriers which preferably is the same for each of the said packets. In this case, said background signal supplied by the auxiliary source of radiation is converted in (a part of) the capacitive charge storage sites of the charge transfer device into packets of background charge.

In the case of a sensor in which the information is thus supplied other than in the form of electric signals, an electric background signal is preferably used, for example in the manner as will be described in detail hereinafter. The information-representing signal and the background signal can generally be supplied each individually in a different manner, for example, electrically, optically or by means of pressure or heat. Furthermore, the said superposition of information and background can be effected either inside the semiconductor body of the device or already outside the body, the superimposed signal being applied to the input.

A charged transfer device according to the invention in which the information is supplied in the form of electric signals will now be described by way of example. This may be realized, for example, in an arrangement as is shown in FIG. 3. The substrate 20 is connected, for example, to a point of reference potential. This is shown diagrammatically in the lefthand part of the figure with a connection 103 which is connected to ground. A clock voltage source 104 shown diagrammatically is furthermore connected to the lines 22 and 24. Said clock voltage source 104 supplies, for example, clock signals $V_{22}$ and $V_{24}$ which are shifted relative to each other by half a cycle. They are, for example, approximately block-shaped or trapezoidal and vary, for example, between a maximum value of approximately +3 Volts and a minimum value of approximately −7 Volts. The direct voltage sources 26 and 27 in this case supply a voltage, for example, of approximately 7 Volts.

To the semiconductor layer 2 a voltage of approximately 20 Volts is applied, for example, via the output contact on the layer 2 which is not shown in FIG. 3 and which is provided at the end of the charge transfer device. This is shown diagrammatically in the right-hand side of FIG. 3 by means of a connection 105 and a voltage source 106 connected thereto. A resistor 107 may be incorporated in said connection, in which case electric output signals can be derived, for example, from a terminal 108.

An input contact 101, 102 which is connected to an input terminal 109 is present at the input end of the charge transfer device which is shown in the left-hand part of FIG. 3. Between the input terminal 109 and the substrate connection 103 an input signal voltage source 110 and in series therewith a controllable voltage source 111 are arranged. The source 110 supplies the electric input signal which represents the incoming information. A background signal is added to the input signal by means of the soure 111. If desired, a switch 114 may be placed across the source 110.

Beside the input contact 101, 102 an input gate electrode 112 is present on the insulating layer. In this case, this is an electrode of polycrystalline silicon, the succeeding metal electrode 13 being connected to the line 25 and via the voltage source 26 hence also to the clock line 24.

In this case, the input terminal 109, the input contact 101, 102 and the input gate electrode 112 belong to the means for locally introducing information in the form of charge consisting of majority charge carriers into the semiconductor layer as well as to the means for locally introducing a constant quantity of majority charge carriers as a background quantity.

After the semiconductor layer 2 has been depleted substantially entirely in the usual manner by applying clock and/or auxiliary voltages, that is to say, that substantially all the mobile charge carriers have been removed therefrom, a series of background pulses is preferably supplied. When the switch 114 is closed and simultaneously a suitable voltage is supplied to the input electrode 112, for example, a block-shaped voltage varying between −7 and +3 volts, the background signal is converted into a series of packets of majority charge carriers which travel from the input contact 101, 102 to the storage site below the electrode 113 and are then further transferred in the direction of the read-out means by means of the clock voltages $V_{22}$ and $V_{24}$. The voltage pulse supplied to the input electrode 112 has in that case its highest voltage value within the time in which the clock voltage $V_{24}$ has also its highest voltage value. These voltage pulses for the input electrode can be supplied by means of a voltage source 115 connected to the input gate electrode 112. When as is usually the case information is to be supplied during each cycle of the clock voltages, however, the input electrode 112 may also be connected to the line 24.

The packets of majority charge carriers which are obtained in this manner by means of the background signal each form a background quantity on which the information can be superimposed in the form of further supplied majority charge carriers. For that purpose the switch 114 is simply opened after some time.

Instead of a direct voltage, a pulsatory voltage may of course also be used as a background signal.

In the present example, a maximum quantity of charge of approximately 0.15 pC can be stored at the given doping concentrations and voltages in each of the storage sites. This corresponds to a number of charge carriers of $5.10^{11}$ atoms/sq.cm below the relevant metal electrode. Approximately 80 percent of said quantity is present in the more highly doped surface layer 17 and approximately 20 percent is present in the lower doped part 19 of the semiconductor layer 2.

The value of the background quantity can be controlled by means of the controllable voltage source 111. With an optimum adjustment the background quantity will be 10 to 50 percent of the above-mentioned maximally stored quantity of charge carriers. As is known, one of the important parameters of charge transfer devices is the so-called transfer inefficiency $\epsilon$, the sum of transfer inefficiency and transport efficiency being equal to 1. The transfer inefficiency is reduced by using a background quantity. Those skilled in the art can comparatively simply determine experimentally the value of the background quantity with which the transfer inefficiency has substantially a minimum value. A further increase of the background quantity will then generally have no or hardly any sense. Dependent upon the use, a smaller background quantity may also be used to obtain a compromise between the transfer inefficiency and the signal swing remaining between the background quantity and the maximum charge quantity.

It will be obvious that the background packets can also be supplied in a different known manner in which other means may be necesary. For example, the input signal and the background signal may be supplied to the input gate electrode 112, a constant or a pulsatory voltage being applied to the contact 101, 102. Two successive input gate electrodes may also be used. In that case, for example, the contact 101, 102 is set up at a fixed voltage, the first gate electrode is operated with a clock voltage which determines at what instants majority charge carriers can be introduced and the second input gate electrode receives the background signal with the input signal superimposed thereon, the voltage at said second gate electrode being decisive of the quantity of majority charge carriers which can be supplied to and stored in the associated capacitive storage site, so in the underlying potential well. Furthermore, the input signal and the background signal may also be supplied to (electric) inputs differing in place and/or construction from each other. The way of operation described here with a background signal is known per se for charge coupled devices in which the storage of charge and the charge transport take place at and along the semiconductor surface. In this case the background signal is used for quite different reasons, however, and moreover also the phenomena on which the effect is based are quite different. Generally it must even be said that the use of a background signal in charge transfer devices in which the charge transport takes place in the interior or bulk of the semiconductor body provides substantially no improvement and on the contrary often is detrimental.

The present invention is inter alia based on the recognition that in certain very special circumstances the use of a background signal in charge transfer devices with bulk transport, however, does provide an improvement, namely when the semiconductor layer has one or more more highly doped surface zones present below the electrodes in which case in addition the effects on which said improvement is based are of a different nature than those underlying the improvement in a surface channel device.

For explanation the following may be remarked. As is known, the transfer rate of the transfer process in charge transfer devices is determined to a considerable extent by a comparatively small last part of the packet of charge carriers to be transferred, which last part is transferred comparatively slowly. In the charge transfer device having charge transport at the surface, said last part of the charge transfer usually takes place by means of a diffusion process which is always comparatively slow. Too rapid an interruption of the transfer process, so too high a clock frequency, results in an incomplete transfer of the charge packets and hence also in cross-talk between successive packets because the charge carriers which stay behind are picked up by one or more subsequent packets. In said devices with surface transport the influence of this effect can be reduced by adding to each packet of information-representing charge a background quantity of charge carriers. It has been found that as long as the quantity of charge involved in the transport process is not too small, the part of the charge staying behind upon interrupting the transfer process depends in an absolute sense little on the value of the originally present quantity of charge to be transferred. So when a "one" is represented by a certain maximum quantity of charge and a "zero" by a minimum quantity which is equal to the background quantity, substantially the same number of charge carriers will stay behind in the original storage site after transfer of a one and after transfer of a zero, said remaining number being substantially equally large as the number of charge carriers which the transferred charge carrier packet picks up in the next storage site in the form of charge carriers staying behind from the preceding packets. In addition, with this way of operation in which charge is transported with each transfer, the detrimental influence which the surface states in said devices may have, is reduced considerably in that in each of the storage sites charge carriers are stored substantially continuously at the surface below the electrode system.

Another possibility of avoiding said restriction of the clock frequency is to cause the transport of charge carriers to take place not along the semiconductor surface but as much as possible in the interior or bulk of the semiconductor body. Since the charge carriers are present at some distance from the semiconductor surface it can be prevented that the transport of the last part of each charge packet must take place by means of a diffusion process which by nature is comparatively slow.

In this embodiment with bulk transport the last part of the transport (also) takes place under the influence of the fringing electric fields produced in the semiconductor body with the aid of insulated electrodes. This last part of the transport thus takes place considerably more rapidly so that the admissible maximum clock frequency is considerably larger and no or not more than a negligible further increase of said clock frequency can be achieved by using background charge. Moreover, the influence of the surface states is also eliminated in this manner because the charge carriers in this case are actually kept away from the semiconductor surface.

In the devices with bulk transport the transport efficiency at least in a part of the clock frequency range to be considered for use is restricted by the presence of traps in the semiconductor material. Said bulk centers are more or less homogeneously distributed in the semiconductor layer and since the volume occupied by a stored quantity of charge increases with the value of said charge, the use of background charge will have no or a negligible influence on the disturbing influence of said bulk centers. That background charge in the devices with surface transport has influence on surface traps is actually based on the fact that said traps are just concentrated in the same place where the stored charge is preferably present, namely immediately at the semiconductor surface and as closely as possible to the electrodes.

In the present device with bulk transport the favorable influence of the background charge is based on the fact that by providing a more highly doped part the stored charged is not homogeneously distributed over the volume occupied by the packet, while said more highly doped part on the other hand gives substantially no change in the distribution of the bulk centers or traps which is assumed to be homogeneous. As already stated, 20 percent of the charge is stored in the comparatively high-ohmic part 19 of the semiconductor layer 2, so that said part of the charge occupies a comparatively large volume. The remaining 80 percent of the charge is present in the more highly doped zone and occupies a comparatively small volume. When the potential well below the electrode of the relevant storage site has a shape that the potential minimum for the majority charge carriers lies in the high-ohmic part 19, said high-ohmic part of the storage site will always be filled first. As a result of this, the greater part of the volume of the storage site can already be filled with a comparatively small quantity of charge, the background charge, with which the influence of the greater part of the bulk centers is then also eliminated or at least considerably decreased.

In many cases, however, the potential minimum in a storage site will not be present in the high-ohmic part 19 but in the low-ohmic part 17 though still below the surface. This means that the background charge will be stored for the greater part in the low-ohmic part 17 so that the above-mentioned effect does not occur. Nevertheless, in this case also the use of background charge provides, a considerable improvement. This may be explained by the fact that the place of the potential minimum during the transport process moves to the high-ohmic part 19. Actually, the device is constructed so that the last part of each charge packet is transported in the bulk at a comparatively large distance from the electrodes. At that instant, background charge, if any, will hence also be present preferably in the high-ohmic part 19 and thus occupy a comparatively large volume. So the background quantity must preferably be chosen to be so large that therewith that part of the high-ohmic layer 19 which is preferably filled at any instant during operation under any electrode because the potential minimum is present therein, can be occupied substantially entirely by the background charge. In this manner, a comparatively large part of the bulk centers is eliminated in this case also with a comparatively small quantity of charge.

For other embodiments of the charge-transfer device which can advantageously be used in the above-described manner, reference is made to the above-mentioned now published Dutch Patent Application No. 7,303,778. It holds in general that those charge transfer devices with bulk transport in which the semiconductor regions which belong to the capacitive storage sites and in which the charge carriers are stored have individual parts with a considerable difference in doping concentration, so that the stored charged is not homogeneously distributed over the volume occupied by the stored charge, are preferably provided with means for supplying a background quantity in the form of packets of charge carriers which can be transported together with a quantity of information-representing charge carriers.

The semiconductor device described can be manufactured entirely in the usual manner in which in this connection reference is also made to now published Dutch Patent Application Nos. 7,114,770 and 7,303,778.

What is claimed is:

1. A bulk-channel charge transfer device comprising an elongated semiconductor channel of one-type conductivity, means for isolating the semiconductor channel, means to locally introduce into the semiconductor channel information in the form of signal-modulated quantities of majority charge carriers and means to read-out said information elsewhere in the channel, said semiconductor channel having a thickness measured perpendicularly to a cooperating electrode system and a doping concentration and being maintained at a potential such that it can be fully depleted throughout its thickness in the absence of externally-introduced free charge carriers, a cooperating electrode system comprising plural electrodes separated by a barrier layer from the semiconductor channel and located at least at one side of the semiconductor channel and responsive to the application of potentials thereto to capacitively generate electric fields in the semiconductor channel for storing charge carriers at spaced sites within the channel below its surface and for transporting the charge carriers through the channel below its surface in the longitudinal direction toward the read-out means, said semiconductor channel forming a double layer comprising upper layer portions at the surface and adjoining lower layer portions both of the same one-type conductivity, said upper layer portions forming a continuous surface layer extending under all of the electrodes, said upper surface layer having a one-type dopant concentration greater than ten times of said lower layer portions and having a thickness of the double layer such that during application of the electrodes of charge storage potentials large packets of charge carriers present are mainly stored in said upper surface layer, and during application to the electrodes of charge transfer potentials the last charge fractions of the packets are mainly transferred through said lower layer portions, and means for improving transfer efficiency including means to introduce into the semiconductor channel a constant quantity of majority charge carriers independent of the signal magnitude as a constant background quantity.

2. A charge transfer device as claimed in claim 1 wherein means are provided connected to the electrode system for applying periodic potentials thereto, said information introduction means comprising an electrical signal source connected to the semiconductor channel, said background introduction means comprising a constant potential source connected to the semiconductor channel.

3. A charge transfer device as claimed in claim 2 wherein the constant potential source is connected to the signal source.

4. A charge transfer device as claimed in claim 1 wherein means are provided for applying cyclic potentials to the electrode system, said background introduction means being operative to introduce a constant quantity of background charge during each cycle of the potentials applied to the electrode system.

* * * * *